(12) United States Patent
Huang et al.

(10) Patent No.: US 8,835,291 B2
(45) Date of Patent: Sep. 16, 2014

(54) STRAINED GATE ELECTRODES IN SEMICONDUCTOR DEVICES

(75) Inventors: Chien-Chao Huang, Hsin-Chu (TW); Fu-Liang Yang, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 900 days.

(21) Appl. No.: 12/404,050

(22) Filed: Mar. 13, 2009

(65) Prior Publication Data

US 2009/0203202 A1 Aug. 13, 2009

Related U.S. Application Data

(63) Continuation of application No. 11/272,661, filed on Nov. 14, 2005, now abandoned.

(51) Int. Cl.
*H01L 21/336* (2006.01)
*H01L 21/8238* (2006.01)

(52) U.S. Cl.
CPC *H01L 21/823807* (2013.01); *H01L 21/823842* (2013.01)
USPC ........... 438/585; 257/192; 257/414; 257/368; 257/E29.003; 438/166; 438/231; 438/530

(58) Field of Classification Search
CPC ..................................................... H01L 21/336
USPC .......... 257/414, 192, 368, E29.003; 438/231, 438/530, 166
See application file for complete search history.

(56) References Cited

U.S. PATENT DOCUMENTS

| | | | |
|---|---|---|---|
| 5,753,544 A * | 5/1998 | Cho et al. ........................ | 438/166 |
| 5,879,975 A * | 3/1999 | Karlsson et al. .............. | 438/162 |
| 6,043,142 A | 3/2000 | Nakajima et al. | |
| 6,064,149 A * | 5/2000 | Raina ............................. | 313/497 |
| 6,221,744 B1 | 4/2001 | Shih et al. | |
| 6,255,204 B1 | 7/2001 | Tobin et al. | |
| 6,268,068 B1 | 7/2001 | Heuer et al. | |
| 6,355,962 B1 | 3/2002 | Liang et al. | |
| 6,573,172 B1 | 6/2003 | En et al. | |
| 6,670,226 B2 | 12/2003 | Lin et al. | |
| 6,670,263 B2 | 12/2003 | Ballantine et al. | |
| 6,720,241 B2 * | 4/2004 | Matsumoto et al. .......... | 438/520 |

(Continued)

OTHER PUBLICATIONS

Nguyen, T., "Hexagonal Phase in Tensile LPCVD Poly-Si Film," Lawrence Berkeley Laboratory, Materials & Chemical Sciences Division, University of California, Jul. 1991, 9 pages.

(Continued)

*Primary Examiner* — Lex Malsawma
*Assistant Examiner* — Sheng Zhu
(74) *Attorney, Agent, or Firm* — Slater and Matsil, L.L.P.

(57) ABSTRACT

Embodiments of the invention provide a semiconductor device and a method of manufacture. MOS devices along with their polycrystalline or amorphous gate electrodes are fabricated such that the intrinsic stress within the gate electrode creates a stress in the channel region between the MOS source/drain regions. Embodiments include forming an NMOS device and a PMOS device after having converted a portion of the intermediate NMOS gate electrode layer to an amorphous layer and then recrystallizing it before patterning to form the electrode. The average grain size in the NMOS recrystallized gate electrode is smaller than that in the PMOS recrystallized gate electrode. In another embodiment, the NMOS device comprises an amorphous gate electrode.

20 Claims, 6 Drawing Sheets

(56) References Cited

U.S. PATENT DOCUMENTS

| | | | |
|---|---|---|---|
| 6,872,613 B1 | 3/2005 | Xiang et al. | |
| 6,893,909 B2 * | 5/2005 | Wang et al. | 438/166 |
| 6,906,393 B2 * | 6/2005 | Sayama et al. | 257/414 |
| 6,927,454 B2 | 8/2005 | Chan et al. | |
| 6,960,781 B2 * | 11/2005 | Currie et al. | 257/19 |
| 6,977,194 B2 | 12/2005 | Belyansky et al. | |
| 7,005,365 B2 | 2/2006 | Chambers | |
| 7,122,849 B2 | 10/2006 | Doris et al. | |
| 7,355,256 B2 | 4/2008 | Togo et al. | |
| 7,678,637 B2 * | 3/2010 | Nandakumar et al. | 438/199 |
| 2002/0093046 A1 | 7/2002 | Moriya et al. | |
| 2002/0192932 A1 | 12/2002 | Tsai et al. | |
| 2003/0047734 A1 | 3/2003 | Fu et al. | |
| 2003/0049919 A1 | 3/2003 | Yamamoto | |
| 2004/0029323 A1 | 2/2004 | Shimizu et al. | |
| 2004/0104405 A1 | 6/2004 | Huang et al. | |
| 2004/0173812 A1 | 9/2004 | Currie et al. | |
| 2005/0040477 A1 | 2/2005 | Xiang et al. | |
| 2005/0136583 A1 | 6/2005 | Chen et al. | |
| 2005/0189597 A1 | 9/2005 | Masuoka et al. | |
| 2005/0199958 A1 * | 9/2005 | Chen et al. | 257/368 |
| 2005/0236668 A1 | 10/2005 | Zhu et al. | |
| 2006/0081942 A1 | 4/2006 | Saito | |
| 2006/0099765 A1 | 5/2006 | Yang | |
| 2006/0160317 A1 | 7/2006 | Zhu et al. | |
| 2009/0001371 A1 * | 1/2009 | Mowry et al. | 257/51 |

OTHER PUBLICATIONS

Skrotzki, W., et al., "Grain Structure and Texture of Cast Iron Aluminides," Cryst. Res. Technol., Jan. 1, 2005, vol. 40, No. 1/2, pp. 90-94.

Miura, H., et al., "Effect of Mechanical Stress on Reliability of Gate-Oxide Film in MOS Transistors," IEDM, IEEE, 1996, pp. 743-746.

Kamins, T.I., "Deformation Occurring During the Deposition of Polycrystalline-Silicon Films," J. Electrochem. Soc., Solid-State Science and Technology, May 1974, vol. 121, No. 5, pp. 681-684.

Murarka, S.P., et al., "Effect of Phosphorus Doping on Stress in Silicon and Polycrystalline Silicon," J. Appl. Phys. 54(4), Apr. 1983, pp. 2069-2072.

Chen, C-H., et al., "Stress Memorization Technique (SMT) by Selectively Strained-Nitride Capping for Sub-65nm High-Performance Strained-Si Device Application," Symposium on VLSI Technology Digest of Technical Papers, IEEE, 2004, pp. 56-57.

Thompson, S.E., et al., "Key Differences for Process-Induced Uniaxial vs. Substrate-Induced Biaxial Stressed and Si and Ge MOSFETs," IEDM, IEEE, 2004, pp. 221-224.

Yang, H.S., et al., "Dual Stress Liner for High Performance sub-45nm Gate Length SOI CMOS Manufacturing,"IEDM, IEEE, 2004, pp. 1075-1077.

* cited by examiner

STRAINED GATE ELECTRODES IN SEMICONDUCTOR DEVICES

This application is a continuation of U.S. patent application Ser. No. 11/272,661, entitled "Strained Gate Electrodes in Semiconductor Devices," filed on Nov. 14, 2005, now abandoned which application is incorporated herein by reference.

TECHNICAL FIELD

This invention relates generally to semiconductor devices, and more specifically to metal oxide semiconductor (MOS) devices having strained channel regions.

BACKGROUND

Miniaturization of metal-oxide-semiconductor field-effect transistors (MOSFETs) has improved speed performance and reduced cost per unit function of integrated circuits. One way to improve transistor performance is through selective application of stress to the transistor channel region. Stress distorts or strains the semiconductor crystal lattice and interatomic bonding. The strain, in turn, affects the band alignment and charge transport properties of the semiconductor. By controlling the magnitude and distribution of stress in a finished device, manufacturers can increase carrier mobility and improve device performance. There are several existing approaches of introducing stress in the transistor channel region.

One approach includes forming an epitaxial, strained silicon layer on a relaxed silicon germanium (SiGe) layer. Because SiGe has a larger lattice constant than Si, the epitaxial Si grown on SiGe will have its lattice stretched in the lateral direction, so the Si will be under biaxial tensile stress. In this approach, the relaxed SiGe buffer layer is referred to as a stressor that introduces stress in the channel region. The stressor, in this case, is placed below the transistor channel region. In another approach, a high-stress film is formed over a completed transistor. The high-stress film distorts the silicon lattice thereby straining the channel region.

One problem facing CMOS manufacturing is that NMOS and PMOS devices require different types of stress in order to achieve increased carrier mobility. For example, a biaxial, tensile stress increases NMOS performance approximately twofold. However, for a PMOS device, such a stress yields almost no improvement. With a PMOS device, a tensile stress improves performance when its perpendicular to the channel, but it has nearly the opposite effect when it is parallel to the channel. Therefore, when a biaxial, tensile film is applied to a PMOS device, the two stress effects almost cancel each other out.

Workers are aware of these problems. Therefore, new CMOS manufacturing techniques selectively address PMOS and NMOS devices. An NMOS fabrication method includes using tensile films to improve carrier mobility. A PMOS fabrication method includes using substrate structures that apply a compression stress to the channel. One PMOS method includes selective application of a SiGe layer into the source/drain regions. Another method uses modified shallow trench isolation (STI) structures that compress the PMOS channel.

The use of additional materials, however, adds further processing steps and complexity to the manufacturing process. Therefore, there remains a need for improving the carrier mobility of both NMOS and PMOS devices without significantly adding to the cost or complexity of the manufacturing process.

SUMMARY OF THE INVENTION

These and other problems are generally solved or circumvented, and technical advantages are generally achieved by preferred embodiments of the present invention that provide methods and structures for introducing stress and strain into semiconductor devices in order to improve charge carrier mobility.

In accordance with an embodiment of the present invention, a method of forming an integrated circuit is provided. The method includes providing a substrate and forming a gate dielectric layer and a gate electrode layer thereon. At least a portion of the gate electrode layer is amorphized, thereby creating an amorphized gate electrode layer.

In accordance with another embodiment of the present invention, another method of forming an integrated circuit is provided. The method includes providing a substrate and forming a gate dielectric layer and a gate electrode layer thereon. At least a portion of the gate electrode layer is amorphized, creating an amorphized gate electrode layer. A cap layer is formed over the gate electrode layer and at least a portion of the amorphized gate electrode layer is crystallized.

In accordance with yet another embodiment of the present invention, yet another method of forming an integrated circuit is provided. The method includes providing a substrate having a first section and a second section. A dielectric layer and a first layer are formed over the substrate in the first section and the second section. A mask layer is formed over the first layer in the first section. Thereafter, at least a portion of the first layer is amorphized in the second section. The mask layer is removed and a cap layer is formed over the first layer in the first section and the second section. The amorphized portion of the first layer in the second section is at least partially crystallized.

Note that although the term layer is used throughout the specification and in the claims, the resulting features formed using the layer should not be interpreted as only a continuous or uninterrupted feature. As will be clear from reading the specification, the layer may be separated into distinct and isolated features (e.g., active regions or device fabrication regions), some or all of which comprise portions of the semiconductor layer.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. The intermediated stages of manufacturing a preferred embodiment of the present invention are illustrated throughout the various views and illustrative embodiments of the present invention.

This invention relates generally to semiconductor device fabrication and more particularly to structures and methods for strained transistors. The present invention will now be described with respect to preferred embodiments in a specific context, namely the creation of PMOS and NMOS transistors. It is believed that embodiments described herein will benefit other applications not specifically mentioned. Therefore, the specific embodiments discussed are merely illustrative of specific ways to make and use the invention, and do not limit the scope of the invention.

Figure 1A:
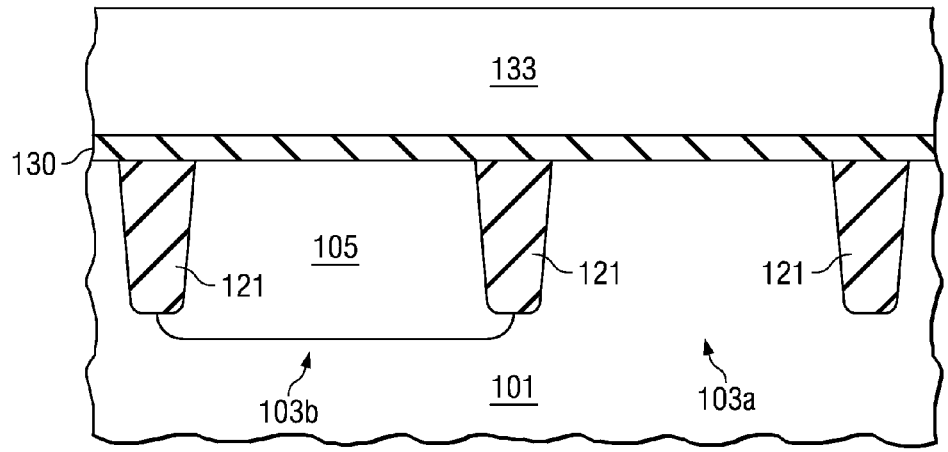
FIGS. 1a and 1b are cross-sectional views of a gate electrode layer according to embodiments of the invention.

Shown in FIG. 1a is a schematic cross-sectional diagram of the semiconductor integrated circuit microelectronic device at an early stage in its fabrication in accord with the preferred embodiments of the invention. The intermediate device includes a substrate 101, which may comprise Si, Ge, SiGe, GaAs, GaAlAs, InP, GaN, or combinations thereof. In addition to bulk wafers, the substrate 101 may also comprise silicon on insulator (SOI) technology. The substrate 101 preferably comprises a p-doped, (100) silicon wafer. The substrate 101 includes first 103a and second 103b active regions suitable for forming different semiconductor devices. Further included within the second active region 103b is a doped well region 105, which is of opposite P or N polarity than the substrate 101 within the first active region 103a.

An isolation structure, such as a shallow trench isolation (STI) region 121, may be formed within the substrate 101 to isolate active regions. STI regions 121 are formed using conventional thermal growth methods and isolation region deposition and patterning methods. In FIG. 1, the first active region 103a is laterally adjacent the second active region 103b for ease of illustration only and is not intended to limit embodiments of the invention.

Formed over the active regions 103 is a gate dielectric layer 130. The gate dielectric 130 may include a thermally grown silicon oxide having a thickness from about 6 to 100 Å, and more preferably less than about 20 Å. In other embodiments, the gate dielectric 130 may include a high-k dielectric having a k-value substantially greater than about 7. Possible high-k dielectrics include $Ta_2O_5$, $TiO_2$, $Al_2O_3$, $ZrO_2$, $HfO_2$, $Y_2O_3$, $L_2O_3$, and their aluminates and silicates. Other suitable high-k gate dielectrics may include hafnium-based materials such as $HfO_2$, $HfSiO_x$, $HfAlO_x$.

A layer of gate electrode material 133 is formed over the gate dielectric 130 layer. The gate electrode material 133 may comprise metals, metal alloys, metal-containing materials, polysilicon (polycrystalline silicon), and polycide (doped polysilicon/metal silicide stack) gate electrode materials. Preferably, the gate electrode material 133 comprises chemical vapor deposition (CVD) polysilicon between about 100 and 10,000 angstroms thick and more preferably between about 500 and 2,000 angstroms. The gate electrode material 133 may further include about 1E20 cm-3 dopant of polarity opposite the channel region of the corresponding MOS device to be formed therefrom. Such doping advantageously provides for enhanced off current (Ioff) performance, enhanced drain saturation current (Idsat) performance and possibly enhanced short channel effect (SCE) performance of a field effect transistor (FET) device formed employing a gate electrode formed from the patterned first gate electrode material layer 133.

Figure 1B:
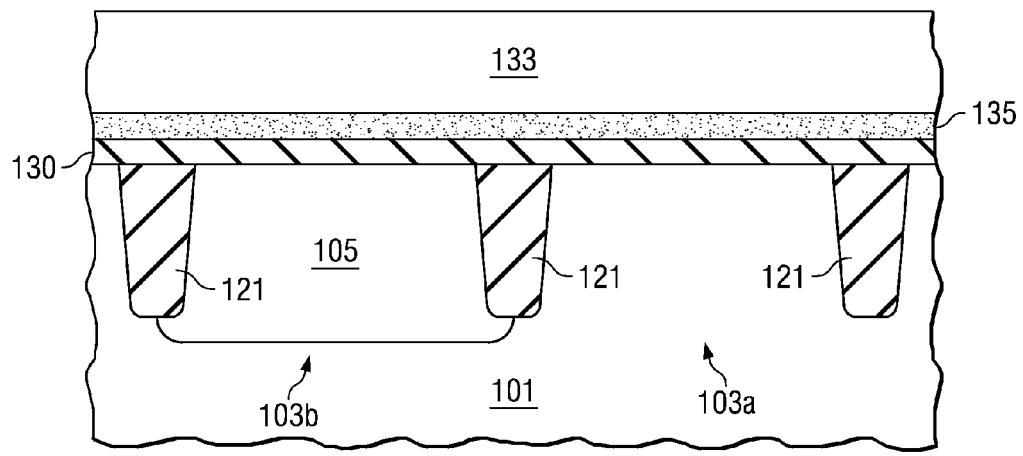

FIG. 1b illustrates an alternative embodiment of the invention wherein an optional glue layer 135 is formed between the dielectric layer 130 and the gate electrode material 133. The glue layer 135 promotes adhesion between adjacent layers. It may be formed by CVD of poly silicon, amorphous silicon, TiN, Ti, Ta, TaN, or combinations thereof.

Figure 2A:
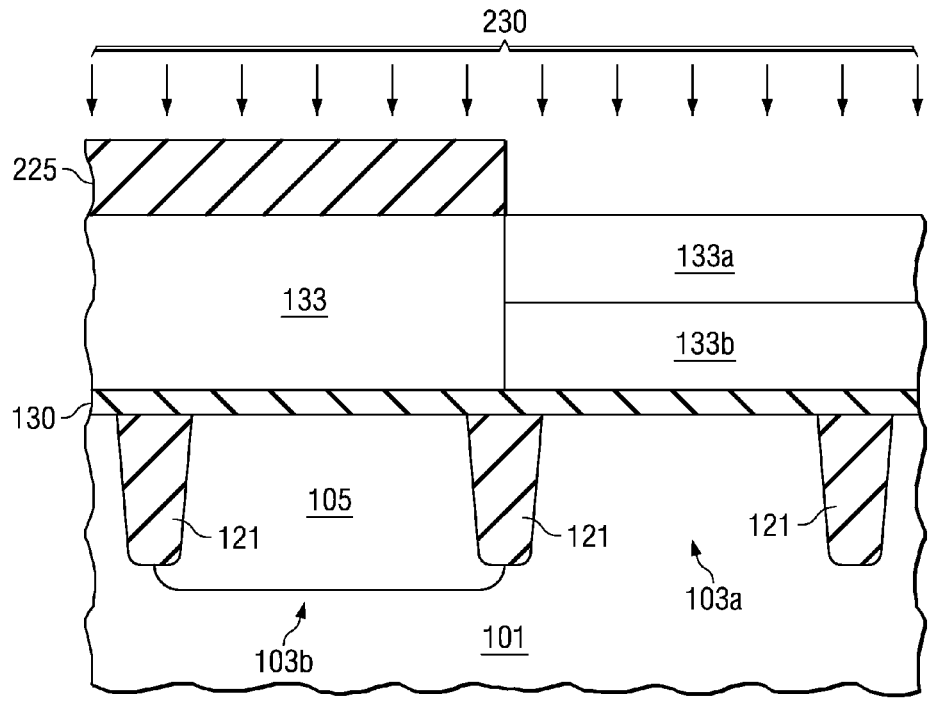
FIGS. 2a and 2b are cross-sectional views of an amorphization implant according to embodiments of the invention.

Turning now to FIG. 2a, there is shown the intermediate structure of FIG. 1a after further processing according to embodiments of the invention. A patterned masking layer 225 formed over the second active region 103b, thereby leaving the first active region 103a exposed. The masking layer 225 may comprise a photo resist, an anti-reflective coating (ARC), a hard mask, or combinations thereof.

An amorphization implant, which is symbolized by arrows 230, is performed next. The amorphization implant 230 may be a conventional beam-line ion implantation process, a plasma immersion ion implantation (PIII), or another ion implantation process known and used in the art. The implant 230 depth in the gate electrode material 133 is preferably from about 100 to 5000 angstroms and more preferably from about 500 to 1000 angstroms at a concentration of preferably from about 1E19 to 1E22 atoms/cm2 and more preferably from about 1E20 to 1E21 atoms/cm$^2$ using In, B, Sb, C, $BF_2$, or O atoms. Other preferred implant species may include As, P, N, Ge, Ar, Kr, or combinations thereof.

As shown in FIG. 2a, the amorphization implant 230 converts a portion of the gate electrode material over the first active region to an amorphous gate electrode material 133a. Because the amorphization implant 230 does not fully penetrate the gate electrode material 133, a portion 133b of the gate electrode material underlying the amorphous gate electrode material 133a is unaffected by the amorphization implant 230.

Figure 2B:
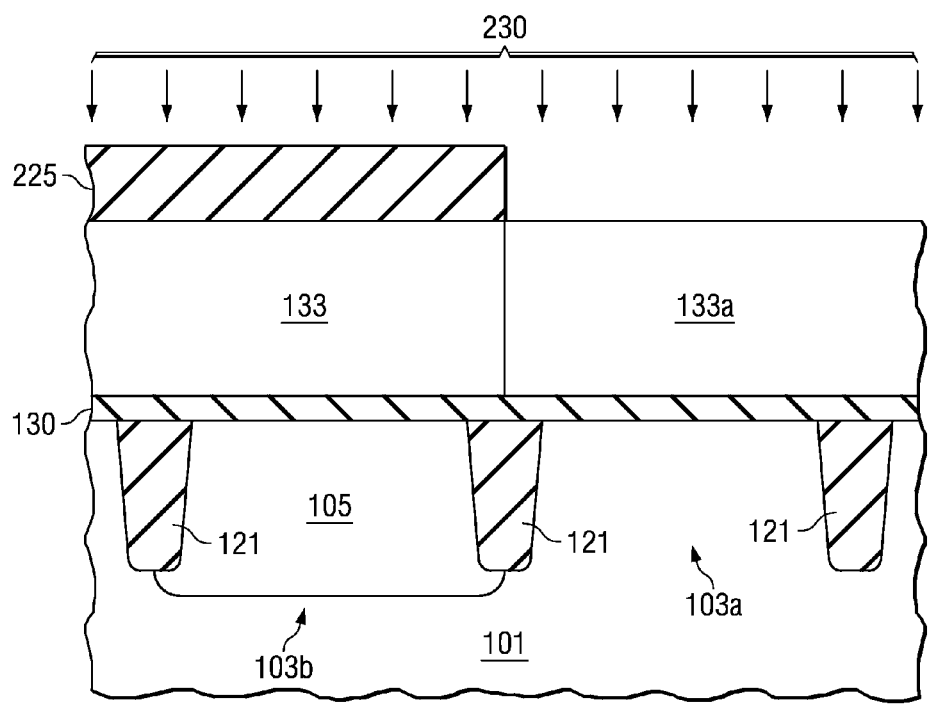

In an alternative embodiment of the invention shown in FIG. 2b, the amorphization implant 230 implant fully penetrates the layer of gate electrode material 133. Therefore, the gate electrode material over the first active region 103a is essentially fully converted into a layer of amorphous gate electrode material 133a.

Figure 3A:
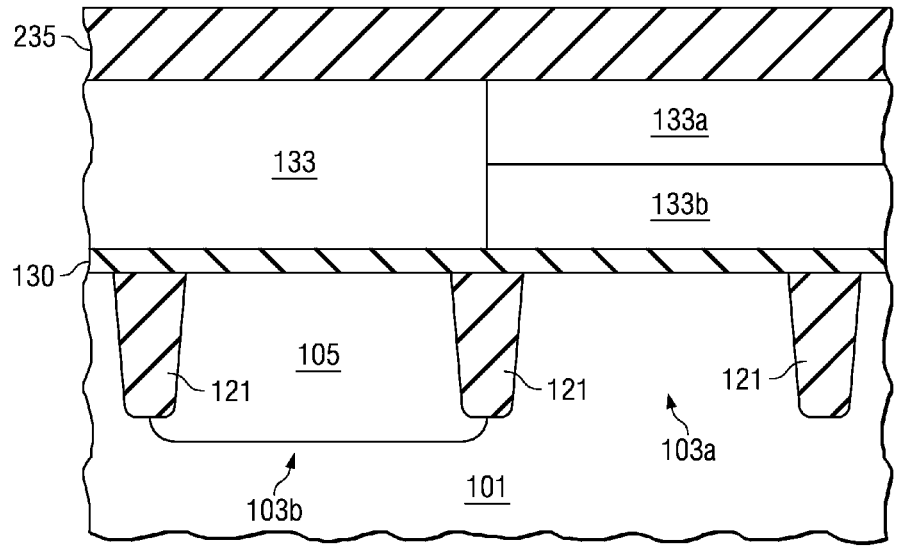
FIGS. 3a-3d are cross-sectional views illustrating a capping layer and gate electrode layer recrystallization according to embodiments of the invention.

Turning now to FIG. 3a, a capping layer 235 is formed over the structure illustrated in FIG. 2a. The capping layer 235 is preferably comprised of a nitrogen-containing material such as silicon nitride, carbon doped silicon nitride, or more preferably silicon oxynitride (SiON). Suitable deposition methods include low pressure CVD (LPCVD), atomic layer deposition (ALD), PECVD, or RTCVD. By adjusting deposition parameters and precursor composition, the capping layer is preferably formed as a low-stress film having an intrinsic stress $<<10^{10}$ dyne/cm$^2$, and more preferably $\approx 0$ dyne/cm$^2$. The deposition temperature is preferably below about 600° C. to avoid recrystallization of the amorphous gate electrode layer 133a and more preferably between about 350° C. and 550° C. The thickness of the capping layer 235 is preferably between about 100 and 1000 angstroms and more preferably between about 200 and 500 angstroms.

As used herein, recrystallizing refers to the process that converts a polycrystalline material having a first grain size to a polycrystalline material having a second grain size. Recrystallizing may also refer to the conversion of an amorphous material to a polycrystalline material.

Figure 3B:
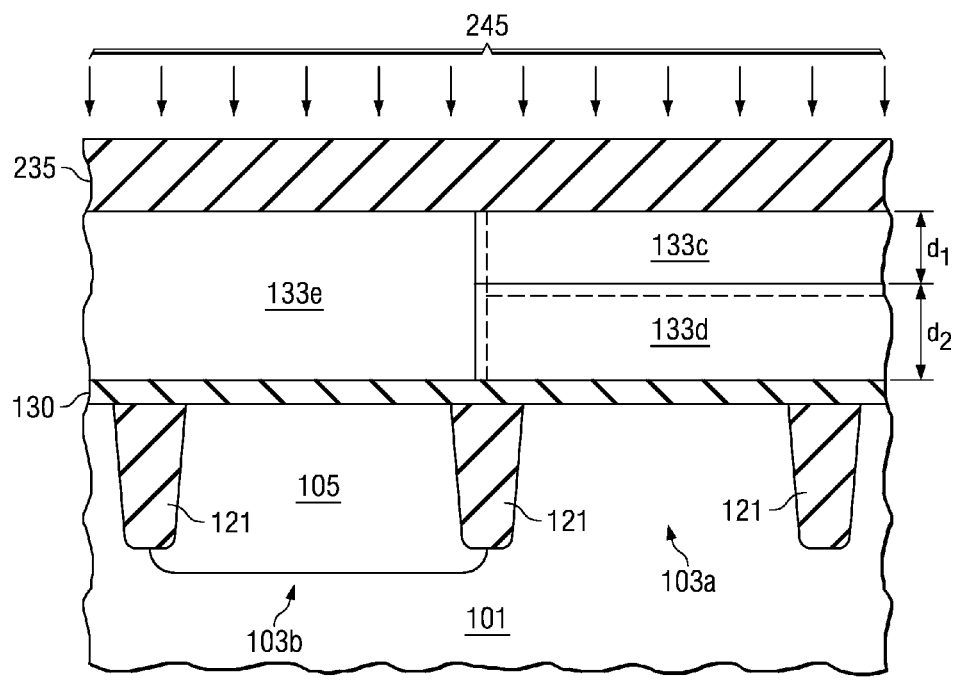

Next, without removing the capping layer 235, an annealing process 245 recrystallizes the gate electrode material as shown in FIG. 3b. The anneal 245 is preferably performed at about 600° C. to 1000° C. and more preferably at about 700° C. to 950° C. using a rapid thermal anneal (RTA) or a spike anneal for at least about 3 seconds, or a furnace anneal for about less than about 1 hr. The annealing process 245 may further include an ambient atmosphere such as nitrogen.

As shown in FIG. 3b, the annealing process 245 forms a first, second, and third recrystallized region, 133c, 133d, 133e, of gate electrode material. The first recrystallized region 133c is proportional in size to the pre-anneal amorphous region, which is symbolized by dashed line in FIG. 3b. However, because crystal grain growth may have a directional component, the first recrystallized region 133c may be larger or smaller than the pre-anneal amorphous region. The second recrystallized region 133d lies substantially under the first crystallized region 133c. Together, the first and second recrystallized regions, 133c and 133d, lie substantially over the first active region 103a of the substrate 101.

In preferred embodiments of the invention, the capping layer 235 stabilizes the solid phase structure of the pre-anneal gate electrode material. That is, if the pre-anneal gate electrode is amorphous, the capping layer 235 stabilizes the amorphous phase. If the pre-anneal material is polycrystalline, the capping layer 235 stabilizes the polycrystalline phase. Therefore, during recrystallization, grain growth within the recrystallized gate electrode material, 133c, 133d and 133e, preferably proceeds from the gate oxide layer 130 towards the capping layer 235. Preferably, the third recrystallized region 133e lies over the second active region 103b of the substrate, and it also lies substantially adjacent the first and second recrystallized regions, 133c and 133d.

In embodiments of the invention, a thickness, d1, of the first recrystallized region 133c is preferably less than a thickness, d2, of the second recrystallized region 133d. More preferably, d1 is between about 0.5*d2 and 0.2*d2. In other embodiments of the invention, d1 is between about 200 and 450 Å. In still other embodiments of the invention, the first and second recrystallized regions, 133c and 133d, comprise nano-grain polysilicon. The nano-grain polysilicon may have a crystal grain size of about 10 nm or less in an embodiment of the invention.

In other embodiments of the invention, d1 is approximately 0 nm. Such an embodiment corresponds to the situation where the amorphous region is initially very thin and/or grain growth from the underlying polycrystalline region dominates the recrystallization. In yet still other embodiments, d2 is approximately 0 nm. Such an arrangement may correspond to the further processing of the embodiment illustrated in FIG. 2b, wherein the layer of gate electrode material over the first active region is fully converted to an amorphous layer (133a, FIG. 2b).

Figure 3C:
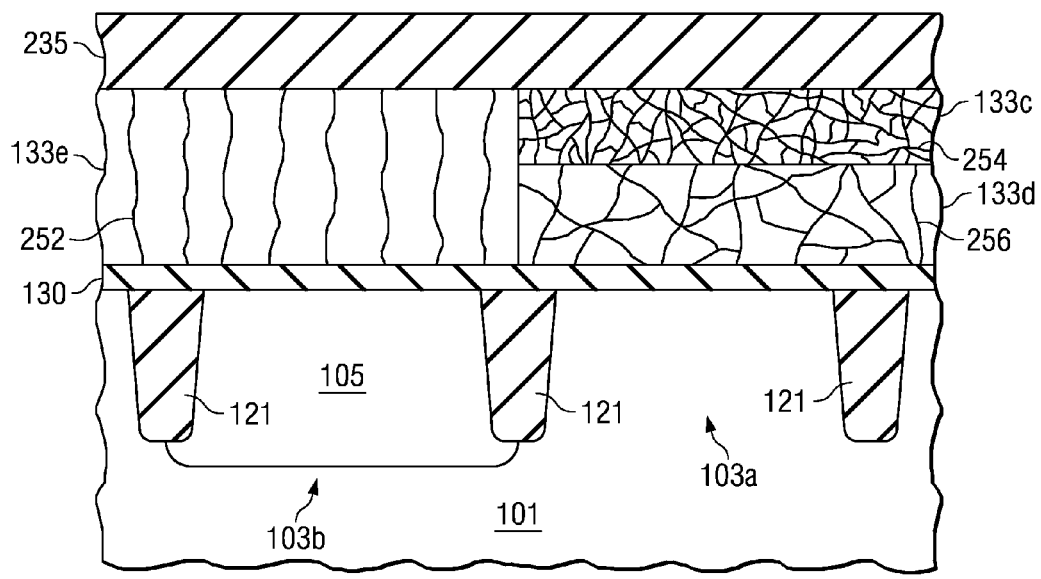

Further details of the grain structure within the first, second, and third recrystallized regions 133c, 133d, 133e are illustrated in FIG. 3c. In a preferred embodiment of the invention, the third recrystallized electrode material 133e comprises a columnar polycrystalline structure. The first and second recrystallized electrode materials, 133c and 133d, may comprise a non-columnar polycrystalline grain structure. More preferably, the first recrystallized region 133c comprises a first equiaxed grain structure 254, and the second recrystallized region 133d comprises a second equiaxed grain structure 256.

In the embodiment illustrated in FIG. 3c, columnar grain boundaries 252 are aligned substantially parallel with the growth axis of the substrate 101. For example, if the substrate 101 has a (1,0,0) growth axis, the columnar growth axis may also be substantially aligned in a [1,0,0] direction, as shown in FIG. 3c. In other embodiments (not shown), the columnar grain boundaries 252 may be inclined or even perpendicular to the growth axis of the substrate 101.

In the embodiment illustrated in FIG. 3c, the mean size of the first equiaxed grains 254 is less than the mean size of the second equiaxed grains 256, and the mean size of both of these grains is smaller than the mean size of the columnar grains 252. While the interfaces between the plurality of recrystallized regions are illustrated as sharp, straight lines, one skilled in the art recognizes that this is for ease of illustration only. One so skilled understands that said interfaces may be irregularly shaped and not clearly defined.

Figure 3D:
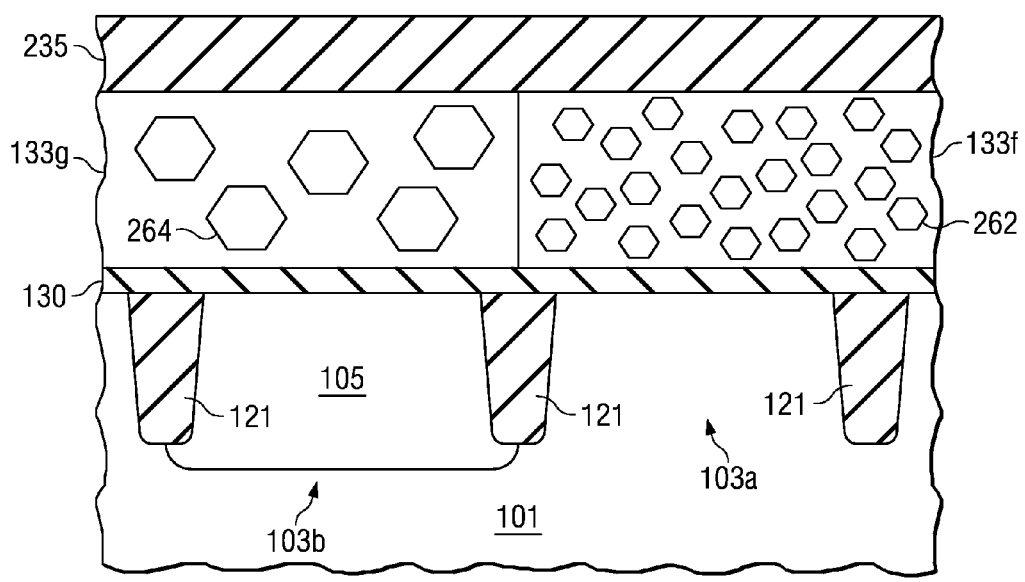

Yet another alternative preferred embodiment of the invention, the grain structure of the recrystallized gate electrode material is schematically illustrated in FIG. 3d. In this embodiment, the gate electrode material is comprised of two regions, which may be labeled as a fourth 133f and a fifth 133g electrode material region. The grain structure of the fourth and fifth electrode material regions, 133f and 133g, is schematically represented by hexagons; however, amorphous materials are within the scope of embodiments of the invention. The fourth region 133f is formed over the first active region 103a, and the fifth region 133g is formed over the second active region 103b. In an embodiment, the forth and fifth regions, 133f and 133g, comprise recrystallized regions, which may have a columnar or an equiaxed grain orientation, or a combination thereof. Preferably, an average grain size 262 within the fourth region 133f is smaller than an average grain size 264 within the fifth region 133g.

In an embodiment, the grain structure of the fourth region 133f comprises an amorphous material. This electrode material may be formed by processing the intermediate structure illustrated in FIG. 2b according to embodiments of the invention. In this embodiment, the capping layer (see e.g., 235, FIG. 3a) stabilizes the amorphous gate electrode material (133a, FIG. 2b). The capping layer serves as a nucleation barrier, thereby substantially limiting recrystallization upon further processing. Therefore, the fourth electrode material 133f in FIG. 3d is recrystallized as described above, while the fifth electrode material 133g is amorphous.

As described above, other embodiments of the invention (not illustrated) may further include a glue layer (see e.g., 135 FIG. 1b) interposed between the recrystallized gate electrode materials, 133f and 133g, and the gate dielectric 130. The glue layer advantageously promotes adhesion between the recrystallized gate electrode materials, 133f and 133g, and the underlying gate dielectric 130.

Figure 4A:
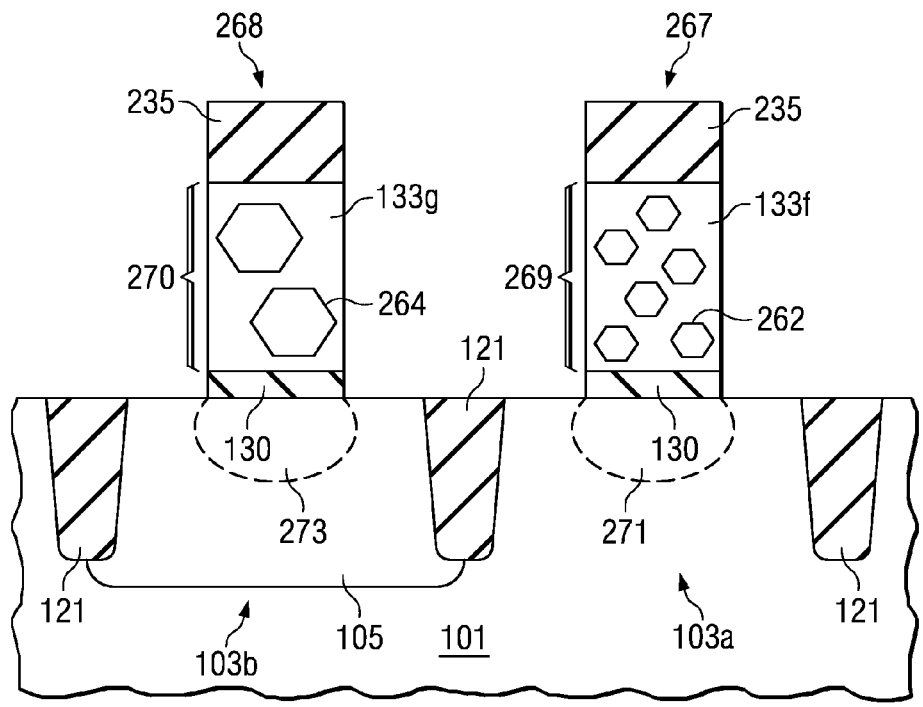
FIGS. 4a-4b are cross-sectional views illustrating crystal grains in gate electrodes according to embodiments of the invention.

Turning now to FIG. 4a, there is illustrated a pair of gate electrode stacks formed after the further processing of the intermediate structure shown in FIG. 3d. Formed over the first active region 103a is a first gate electrode stack 267 comprising a portion of the fourth recrystallized gate electrode material 133f that is patterned to form a first polycrystalline gate electrode 269. Formed over the second active region 103b is a second gate electrode stack 268 comprising a portion of the fifth recrystallized gate electrode material 133g that is patterned to form a second polycrystalline gate electrode 270.

The average grain size of the first gate electrode 269 is preferably smaller than the average grain size of the second gate electrode 270. Preferably, the difference in the average grain size is greater than about 2 nm, and more preferably greater than about 10 nm. The grain distribution within the first and second gate electrodes, 269 and 270, may be widely distributed or mono-dispersed, randomly oriented, columnar or equiaxed, or combinations thereof.

In further keeping with embodiments of the invention, the respective grain size of each gate electrode induces a corresponding strain effect within an underlying substrate portion. Continuing with FIG. 4a, underlying the first gate electrode stack 267 there is formed within the first active region 103a first strain region 271. Underlying the second gate electrode stack 268 there is formed within the second active region 103b a second strain region 273. Because the average grain size of the first gate electrode 269 is smaller than the average grain size of the second gate electrode 270, the first strain region 271 is advantageously more tensile (or less compressive) than the second strain region 273. Preferably, the first strain region 271 is tensile, and the second strain region 273 is compressive.

By allowing for the selective control of the gate electrode crystal grains, embodiments of the invention provide methods and structures that are optimized for the fabrication of NMOS and PMOS transistors. In the embodiment illustrated in FIG. 4a, the preferred means of optimization comprises a difference in average crystal grain size. Other embodiments, as illustrated below, further enhance control of the strain within NMOS and PMOS regions.

Figure 4B:
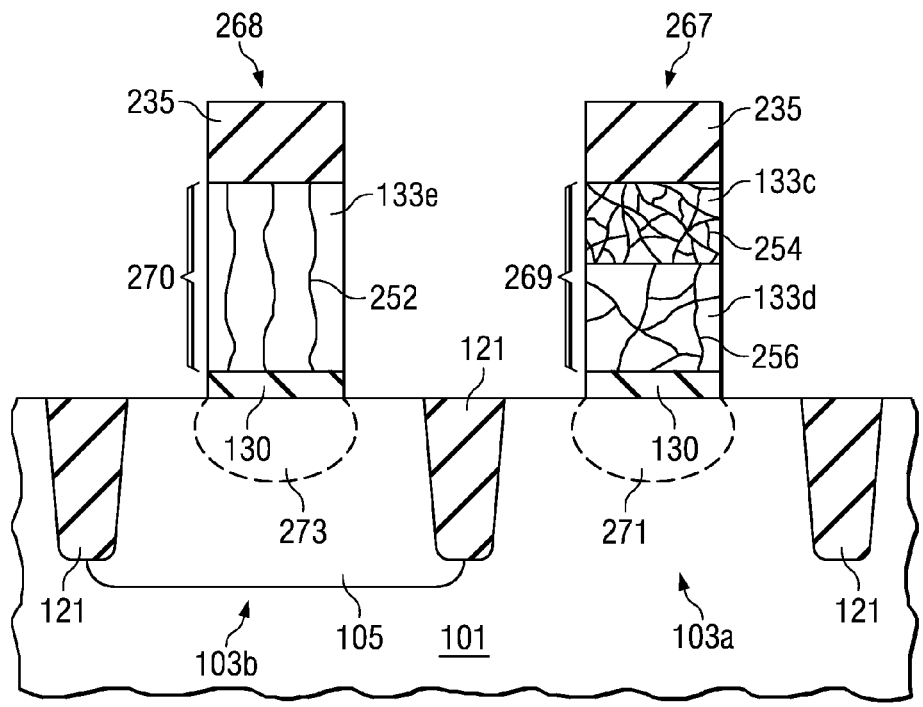

Turning now to FIG. 4b, there is illustrated a pair of gate electrode stacks formed after the further processing of the intermediate structure shown in FIG. 3c. In the embodiment of FIG. 4b, the first gate electrode 269 preferably comprises a first and second sub-layer of patterned gate electrode material. In keeping with embodiments provided above, the two layers comprise the first and second layers of recrystallized gate electrode material, 133c and 133d. The second gate electrode 270 preferably comprises a patterned layer of the third recrystallized gate electrode material 133e. As described above, the average grain size of the first gate electrode 269 is preferably less than the second gate electrode 270.

As shown in FIG. 4b, the first gate electrode 269 may comprise equiaxed grains, and the second gate electrode may comprise columnar grains. Such an arrangement of grains is preferred, but not required of embodiments of the invention. For example, the first, second, and third recrystallized layers of gate electrode material, 133c, 133d, 133e, may independently comprise grains that are widely distributed or mono-dispersed, randomly oriented, columnar or equiaxed, or combinations thereof. Most preferably, however, the average crystal grain size of the first gate electrode 269 is less than the average crystal grain size of the second gate electrode 270. In further keeping with embodiments of the invention provided above, the first strain region 271 is preferably more tensile (less compressive) than the second strain region 273.

In order to further control the stress/strain distribution, embodiments may further include using implant dopants, which may induce or inhibit nucleation, grain growth, and recrystallization. Typically, a gate electrode having an intrinsic compressive/tensile stress induces the opposite stress (i.e. tensile/compressive) within the substrate underlying the gate electrode. For example, a gate electrode having an intrinsic tensile stress of about 4.50E9 dyne/cm$^2$ may induce a compressive stress in the channel region of approximately the same magnitude. In other embodiments, a gate electrode having an intrinsic tensile/compressive stress of about 2500 MPa may induce a corresponding channel strain in the range of about compressive/tensile 1.5%.

Figure 5:
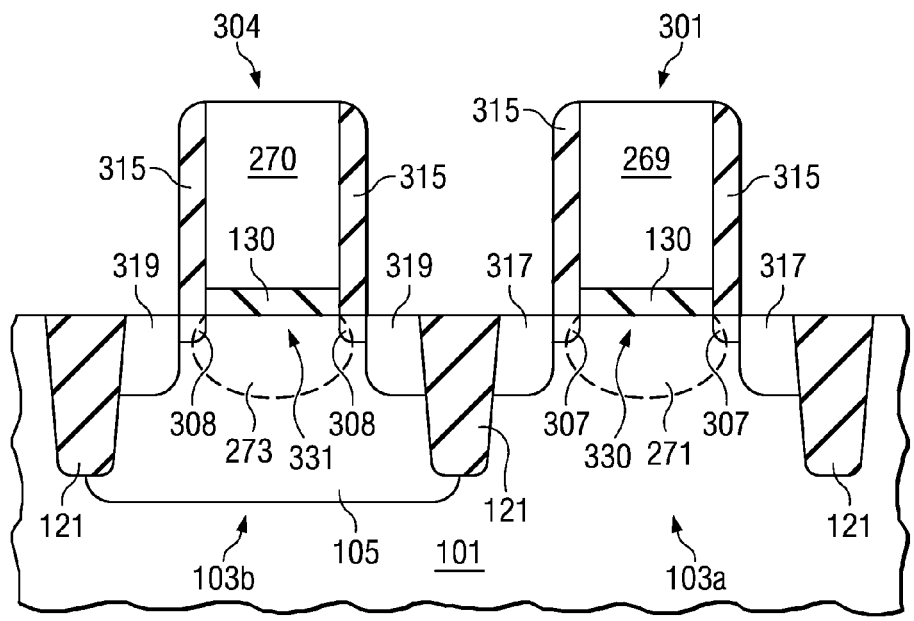
FIG. 5 is a cross-sectional view of a CMOS device according to the embodiments of the invention.

Turning now to FIG. 5, the intermediate structures of FIGS. 4a and 4b may be completed according to conventional semiconductor fabrication methods, which may include several of the following steps. For example, completing the intermediate structure of FIG. 4a may include forming a CMOS device comprising an NMOSFET 301 in the first active region 103a and a PMOSFET 304 in the second active region 103b. The capping layer (235, FIG. 4a) is removed by etching using an acid such as HF, $H_3PO_4$, or by using a dry etch.

Using the gate electrodes, 269 and 270, as a mask, lightly doped source/drain (LDS/LDD) regions are formed in the substrate 101 to a depth between about 100 and 1000 angstroms and preferably between about 200 and 400 angstroms. An N-LDS/LDD region 307 is formed by ion implanting phosphorus or arsenic dopant ions from about $1*10^{13}$ ions/cm2 to about $5*10^{14}$ ions/cm$^2$ at an energy from about 30 keV to about 80 keV. After annealing the concentration of phosphorus or arsenic dopant in the LDS/LDD regions 307 is from about $5*10^{16}$ atoms/cm$^3$ to about $1*10^{19}$ atoms/cm$^3$.

Between the N-LDS/LDD regions 307 there is an NMOS channel region 330. Preferably, the NMOS channel region 330 lies within the first strain region 271. More preferably, the first strain region 271 comprises a tensile stress that is aligned substantially between the N-LDS/LDD regions 307.

A P-LDS/LDD region 308 is formed by ion implanting boron or boron difluoride, $BF_2$, with a dose from about $1*10^{13}$ ions/cm$^2$ to about $5*10^{14}$ ions/cm$^2$ at an energy from about 15 keV to about 50 keV. After annealing the concentration of boron dopant in the P-LDS/LDD region 308 is about $5*10^{16}$ atoms/cm$^3$ to about $1*10^{19}$ atoms/cm$^3$. Preferably, the PMOS channel region 331 lies within the second strain region 273.

Formed on sidewalls of the gate electrodes 269 and 270 are sidewall spacers 315. The sidewall spacers 315 are a dielectric, such as CVD silicon oxide. Using the gate electrodes 269 and 270 and also sidewall spacers 315 as a mask, heavily doped source/drain regions are formed.

Heavily doped P+ doped source/drain regions 319 in N-well 105 are self-aligned with gate electrode 270 and sidewall spacers 315. The P+ source/drain regions 319 extend below the P− lightly doped LDS/LDD regions 308. The P+ regions source/drain regions may be implanted with a dose of boron dopant in a range from about $1*10^{14}$ ions/cm$^2$ to about $1*10^{16}$ ions/cm$^2$ at an energy from about 10 keV to about 80 keV. After annealing, the concentration of boron dopant in the regions 319 is preferably between about $5*10^{18}$ atoms/cm$^3$ and $5*10^{20}$ atoms/cm$^3$.

Heavily doped N+ doped source/drain regions 317 are formed in the first active area 103a and self-aligned with gate electrode 269 and also with sidewall spacers 315. The heavily doped N+ source/drain regions 317 preferably extend below the P− lightly doped LDS/LDD regions 307 as shown in FIG.

5. The heavily doped N+ source/drain 317 regions may be ion implanted with a dose of phosphorus or arsenic dopant from about $1*10^{14}$ ions/cm$^2$ to about $1*10^{16}$ ions/cm$^2$ at an energy from about 10 keV to about 80 keV. After annealing, the concentration of phosphorus or arsenic dopant in the source/drain regions 317 is preferably between about $5*10^{18}$ atoms/cm$^3$ to about $5*10^{20}$ atoms/cm$^3$.

One skilled in the art will recognize that embodiments of the invention may be integrated with other methods and structures suitable for strained channel transistors. For example, shallow trench isolation (STI) structures may induce stress in n-channel and p-channel transistors separately. A first isolation trench may include a first liner, and a second isolation trench may include a second liner. The liners may comprise a suitable stress layer material, and it may be used to modulate channel stress. For example, in modulating the channel stress may include implanting the liner with ions removed. A liner may be modified in some but not all of a plurality of trenches.

Figure 6A:
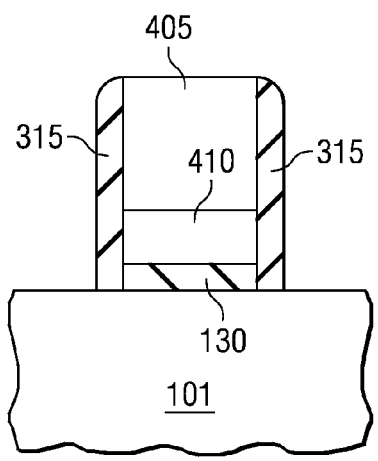
FIGS. 6a and 6b are cross-sectional views illustrating additional stressors incorporated within gate electrodes according to embodiments of the invention.
Figure 6B:
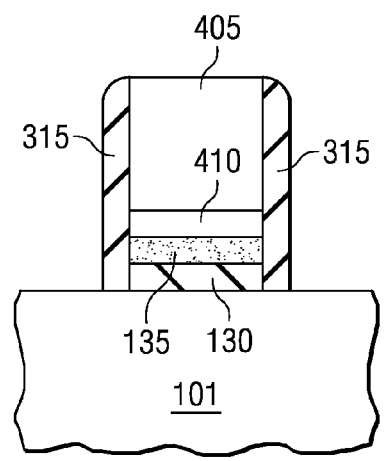

For example, yet another embodiment of the invention may comprise incorporating a stressor 410 as shown in FIG. 6a. The stressor 410 may comprise a well-defined layer between the gate dielectric layer 130 and the gate electrode 405. In such an embodiment, a thickness of the stressor 410 is preferably at least about 25% a thickness of the gate electrode 405. In other embodiments, not illustrated, the stressor may not be a distinct layer, but it may comprise a material dispersed throughout of the gate electrode 405. As shown in FIG. 6b, still other embodiments may further include a glue layer 135 interposed between the stressor 410 and the gate dielectric 130.

Continuing with FIGS. 6a and 6b the stressor 410 may comprise a material having an intrinsic tensile or compressive stress. In other embodiments, it may comprise a conductive material or a dielectric. Suitable compressive, conductive stressors 410 may comprise amorphous silicon or SiGe. Suitable tensile, conductive stressors 410 may comprise NiSi, CoSi2, or poly Si. Suitable dielectric stressors 410, which are tensile or compressive depending on deposition method or stoichiometry, may comprise SiN, SiC, and/or oxides.

Another strained semiconductor method that may be integrated with embodiments includes forming a stressor such as a stress layer formed over NMOS and PMOS devices to induce a strain in the channel region. For example, a highly tensile stress/strain film is known to induce a tensile channel stress/strain. Likewise, a highly compressive stress/strain film is known to induce a compressive channel stress/strain. Embodiments of the invention may further include depositing a uniform stress film over a device, such as a CMOS device and thereafter modulating or adjusting an appropriate stress property of the film in order to achieve a desired channel stress.

One modulating treatment may comprise local stress relaxation by ion bombardment or implantation using, for example, germanium, silicon, xenon, argon, oxygen, nitrogen, carbon, or germanium, and combinations thereof. Other treatments may include changing the composition (e.g., oxidation and/or nitridation) of the stress layer using, for example, a process such as thermal, plasma, ozone, UV, a steam oxidation, a steam environment, and/or combinations thereof. Other treatment methods may include film densification using, for example, a zone treatment, e-beam curing, UV curing, laser treatment (either with or without an absorption or reflection capping layer).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit, the method comprising:
    providing a substrate;
    forming a gate dielectric layer over the substrate;
    forming a gate electrode layer over the gate dielectric layer, the gate electrode layer being crystalline or polycrystalline;
    amorphizing, after the forming the gate electrode layer, only an upper portion of the gate electrode layer, thereby creating an amorphized gate electrode layer, a lower portion of the gate electrode layer remaining crystalline or polycrystalline, the lower portion of the gate electrode having a first grain structure, the lower portion of the gate electrode layer being interposed between the upper portion of the gate electrode layer and the substrate;
    recrystallizing the upper portion of the gate electrode layer such that the upper portion has a second grain structure after the recrystallizing, the second grain structure being a different grain structure than the first grain structure of the lower portion; and
    after the amorphizing, patterning the gate electrode layer to form a gate electrode.

2. The method of claim 1, wherein the amorphizing is performed at least in part by an implantation.

3. The method of claim 1, further comprising forming a cap layer over the amorphized gate electrode layer.

4. The method of claim 1, wherein the recrystallizing the amorphized gate electrode layer is performed at least in part by annealing.

5. The method of claim 1, further comprising forming a glue layer interposed between the gate dielectric layer and the gate electrode layer.

6. The method of claim 1, further comprising forming a stress layer interposed between the gate dielectric layer and the gate electrode layer.

7. The method of claim 3, wherein the cap layer is a nitrogen-containing cap layer.

8. The method of claim 3, wherein the cap layer has an intrinsic stress.

9. A method of forming an integrated circuit, the method comprising:
    providing a substrate;
    forming a gate dielectric layer over the substrate;
    forming a gate electrode layer over the gate dielectric layer, the gate electrode layer being crystalline or polycrystalline;
    amorphizing, after the forming the gate electrode layer, at least a portion of the gate electrode layer, thereby creating an amorphized gate electrode layer;

stabilizing an amorphous phase of an upper surface of the gate electrode layer, the stabilizing being performed at least in part by forming a cap layer over the gate electrode layer;

crystallizing at least a portion of the amorphized gate electrode layer, the crystallizing being performed while the cap layer is over the gate electrode layer; and implanting ions to form source/drain regions, the implanting being a separate process from the amorphizing.

10. The method of claim 9, wherein a thickness of the gate electrode layer is completely amorphized during the amorphizing.

11. The method of claim 9, wherein the amorphizing is performed at least in part by an implantation.

12. The method of claim 9, wherein the crystallizing is performed at least in part by annealing.

13. A method of forming an integrated circuit, the method comprising:

providing a substrate;

forming a gate dielectric layer over the substrate;

forming a gate electrode layer over the gate dielectric layer;

forming a mask layer over at least a portion of the gate electrode layer;

amorphizing, after the forming the mask layer, at least a portion of the gate electrode layer, thereby creating an amorphized gate electrode layer, the mask layer reducing the amorphizing of the gate electrode layer underlying the mask layer;

forming a cap layer over the gate electrode layer;

crystallizing at least a portion of the amorphized gate electrode layer; and implanting ions to form source/drain regions, the implanting being a separate process from the amorphizing.

14. A method of forming an integrated circuit, the method comprising:

providing a substrate, the substrate having a first section and a second section;

forming a dielectric layer over the substrate in the first section and the second section;

forming a first layer over the dielectric layer in the first section and the second section;

forming a mask layer over the first layer in the first section;

amorphizing at least a portion of the first layer in the second section, the amorphizing converting the portion of the first layer from a crystalline or polycrystalline region to an amorphous region;

removing the mask layer;

forming a nitrogen-containing cap layer over the first layer in the first section and the second section, the nitrogen-containing cap layer stabilizing a solid phase structure of the first layer;

at least partially crystallizing the amorphized region of the first layer, the at least partially crystallizing the amorphized region being performed while the nitrogen-containing cap layer is over the first layer; and forming, after the at least partially crystallizing, lightly doped source/drain regions.

15. The method of claim 14, further comprising forming a first transistor in the first section and a second transistor in the second section, wherein the dielectric layer and the first layer are used to form a gate dielectric and a gate electrode for each of the first transistor and the second transistor.

16. The method of claim 15, wherein the first transistor is a PMOS transistor and the second transistor is an NMOS transistor.

17. The method of claim 14, wherein the amorphizing creates an amorphized layer and an un-amorphized layer, the amorphized layer and the un-amorphized layer being portions of the first layer in the second section, the un-amorphized layer being thicker than the amorphized layer.

18. The method of claim 17, wherein the amorphized layer is about 0.2 to about 0.5 times a thickness of the un-amorphized layer.

19. The method of claim 14, further comprising forming a glue layer interposed between the dielectric layer and the first layer.

20. The method of claim 14, further comprising forming a stress layer interposed between the dielectric layer and the first layer.

* * * * *